United States Patent
Murphy et al.

(10) Patent No.: US 11,749,318 B2
(45) Date of Patent: Sep. 5, 2023

(54) INTERFACE PROTOCOL CONFIGURATION FOR MEMORY

(71) Applicant: Micron Technology, Inc., Boise, ID (US)

(72) Inventors: Richard C. Murphy, Boise, ID (US); Glen E. Hush, Boise, ID (US); Honglin Sun, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/888,457

(22) Filed: Aug. 15, 2022

(65) Prior Publication Data

US 2022/0392499 A1   Dec. 8, 2022

Related U.S. Application Data (62) Division of application No. 16/811,361, filed on Mar. 6, 2020, now Pat. No. 11,417,372.

(51) Int. Cl.
| | |
|---|---|
| *G11C 7/10* | (2006.01) |
| *G06F 13/38* | (2006.01) |
| *G06F 9/30* | (2018.01) |
| *G06F 9/54* | (2006.01) |

(52) U.S. Cl.
CPC ........ *G11C 7/1045* (2013.01); *G06F 9/30189* (2013.01); *G06F 9/30196* (2013.01); *G06F 9/546* (2013.01); *G06F 13/387* (2013.01); *G11C 7/1039* (2013.01)

(58) Field of Classification Search
CPC . G11C 7/1045; G11C 7/1039; G06F 9/30189; G06F 9/30196; G06F 9/546; G06F 13/387

USPC ..................................................... 365/230.06
See application file for complete search history.

(56) References Cited

U.S. PATENT DOCUMENTS

| | | |
|---|---|---|
| 5,050,095 A | 9/1991 | Samad |
| 7,043,466 B2 | 5/2006 | Watanabe et al. |
| 9,712,186 B1 * | 7/2017 | Schulz .................. H04L 1/0078 |
| 9,959,937 B2 * | 5/2018 | Kada ...................... G11C 29/44 |
| 10,141,034 B1 | 11/2018 | Zitlaw |
| 2004/0073764 A1 | 4/2004 | Andreasson |
| 2014/0082260 A1 | 3/2014 | Oh et al. |
| 2016/0034203 A1 | 2/2016 | Jang et al. |
| 2018/0067890 A1 | 3/2018 | Espeseth et al. |
| 2018/0136878 A1 | 5/2018 | Madpur et al. |

OTHER PUBLICATIONS

International Search Report and Written Opinion from related International Patent Application No. PCT/US2021/020817, dated Jun. 25, 2021, 11 pages.

* cited by examiner

*Primary Examiner* — Ly D Pham
(74) *Attorney, Agent, or Firm* — Brooks, Cameron & Huebsch, PLLC (57) ABSTRACT

Apparatuses and methods can be related to configuring interface protocols for memory. An interface protocol can define the commands received by a memory device utilizing pins of an interface of a memory device. An interface protocol used by a memory device can be implemented utilizing a decoder of signals provided through the pins of the memory device. The decoder utilized by a memory device can be selected by setting a mode register of the memory device.

20 Claims, 4 Drawing Sheets

OPERATING A PLURALITY OF PINS OF A MEMORY DEVICE IN ACCORDANCE WITH A FIRST INTERFACE PROTOCOL IN A FIRST MODE, WHEREIN OPERATING IN THE FIRST MODE INCLUDES DECODING A FIRST COMMAND RECEIVED FROM A HOST VIA THE PLURALITY OF PINS ACCORDING TO THE FIRST INTERFACE PROTOCOL AND INTERPRETING BINARY VALUES OF SIGNALING VIA THE PLURALITY OF PINS ACCORDING TO THE FIRST INTERFACE PROTOCOL ─460

OPERATING THE PLURALITY OF PINS OF THE MEMORY DEVICE IN ACCORDANCE WITH A SECOND INTERFACE PROTOCOL IN A SECOND MODE, WHEREIN OPERATING IN THE SECOND MODE INCLUDES DECODING A SECOND COMMAND RECEIVED FROM A HOST VIA THE PLURALITY OF PINS ACCORDING TO THE SECOND INTERFACE PROTOCOL AND INTERPRETING BINARY VALUES OF SIGNALING RECEIVED VIA THE PLURALITY OF PINS OF THE INTERFACE ACCORDING TO THE SECOND INTERFACE PROTOCOL ─462

INTERFACE PROTOCOL CONFIGURATION FOR MEMORY

PRIORITY INFORMATION

This application is a Divisional of U.S. patent application Ser. No. 16/811,361, filed on Mar. 6, 2020, the contents of which are incorporated herein by reference.

TECHNICAL FIELD

The present disclosure relates generally to memory, and more particularly to apparatuses and methods associated with configuring an interface protocol for memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. including, but not limited to personal computers, portable memory sticks, digital cameras, cellular telephones, portable music players such as MP3 players, movie players, and other electronic devices. Memory cells can be arranged into arrays, with the arrays being used in memory devices.

The memory may be provided commands utilizing an interface protocol. The commands provided to the memory may be predefined and may be used to control the function of the memory.

DETAILED DESCRIPTION

The present disclosure includes apparatuses and methods related to configuring an interface protocol for memory. A memory device can include a plurality of pins. The memory device may receive a plurality of signals through the plurality of pins. For example, the memory device may receive commands, addresses, and/or data, among other signals, through the plurality of pins. As used herein, the plurality of pins can physically couple a memory device to a computing system. The pins of the memory device are a physical interface that enables communication between the memory device and the computing system.

In various examples, a protocol may define the use of the plurality of pins. Such a protocol is described herein as an interface protocol. The interface protocol can define how the pins of the memory device are used and/or what type of data is received through the plurality of pins. For example, the interface protocol can define that a first portion of the pins are used for commands, a second portion of the pins are used for addresses, and/or a third portion of the pins are used for data, among other uses of the pins.

The interface protocol is defined as the communication between a memory device and a device external to the memory device. Devices can be compliant to an interface protocol if they communicate as defined by the interface protocol. The interface protocol can be defined such that a memory device can receive and process signals from a plurality of devices external to the memory device, where the plurality of devices are manufactured by a plurality of different providers. An example of an interface protocol is the double data rate (e.g., DDR 5) standard. In various instances, the interface protocol can be generated by an organization, such as the JEDEC, which enables any devices compliant with the interface protocol to communicate with each other without the added expense of defining a new interface protocol for multiple devices.

An interface protocol can be limited in its ability to define communications between devices due to the limitations on the quantity of pins that a memory device can have. For example, a memory device can have 168 pins, 184 pins, or 240 pins, among other quantities of pins that are available for memory devices. Each of the pins can be configured to communicate particular commands, addresses, or data. Additional functionality that is not included in the interface protocol may not be provided to the memory device due to an unavailability of pins through which to provide the additional functionality.

In a number of examples, the limitation of the quantity of pins can be overcome by implementing multiple interface protocols. The multiple interface protocols can be implemented in a single device utilizing multiple decoders. A decoder can be selected to provide a device with the ability to decode commands.

Figure 1:
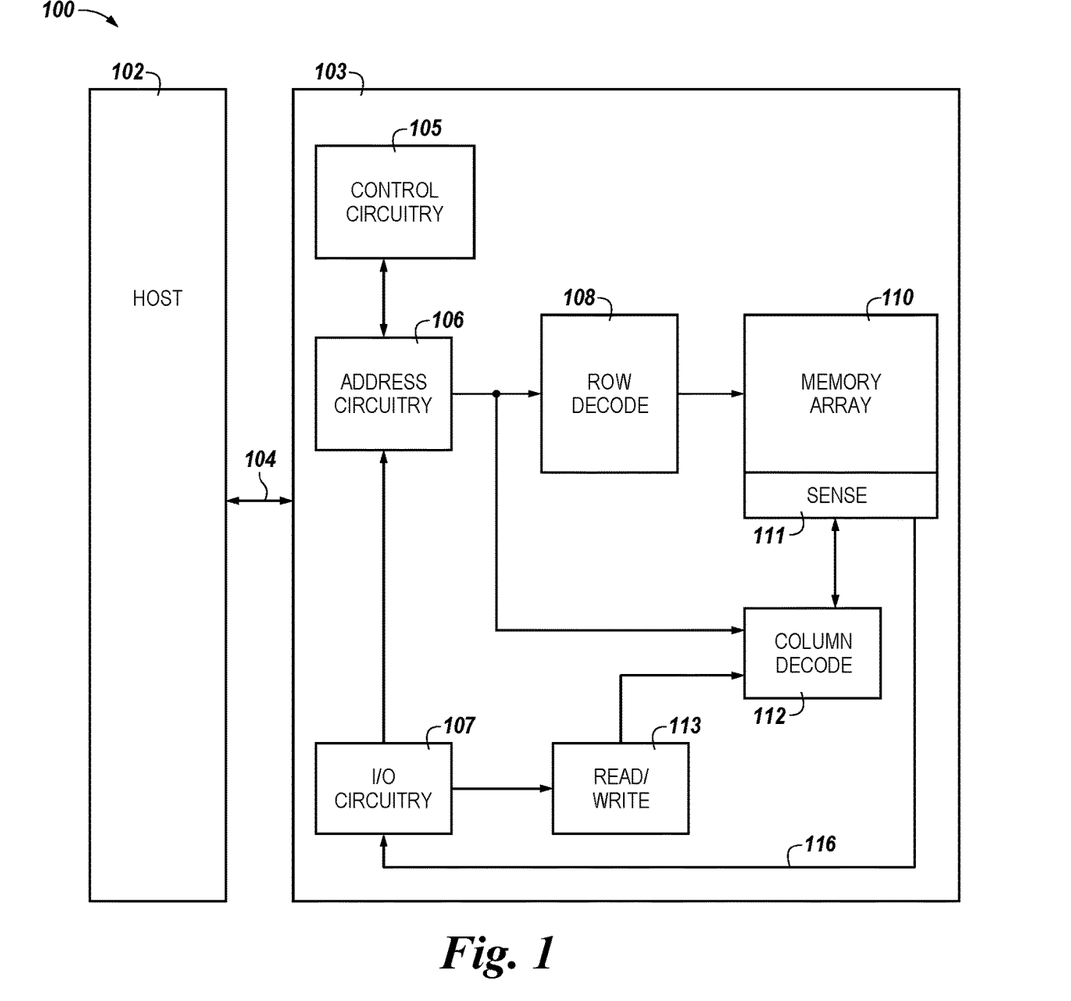
FIG. 1 is a block diagram of an apparatus in the form of a computing system including a memory device in accordance with a number of embodiments of the present disclosure.

FIG. 1 is a block diagram of an apparatus in the form of a computing system 100 including a memory device 103 in accordance with a number of embodiments of the present disclosure. As used herein, a memory device 103, a memory array 110, and/or a host 102, for example, might also be separately considered an "apparatus."

In this example, the computing system 100 includes a host 102 coupled to memory device 103 via an interface 104. The computing system 100 can be a personal laptop computer, a desktop computer, a digital camera, a mobile telephone, a memory card reader, or an Internet-of-Things (IoT) enabled device, among various other types of systems. Host 102 can include a number of processing resources (e.g., one or more processors, microprocessors, or some other type of controlling circuitry) capable of accessing memory. The computing system 100 can include separate integrated circuits, or both the host 102 and the memory device 103 can be on the same integrated circuit. For example, the host 102 may be a system controller of a memory system comprising multiple memory devices 103, with the system controller providing access to the respective memory devices 103 by another processing resource such as a central processing unit (CPU).

In the example shown in FIG. 1, the host 102 is responsible for executing an operating system (OS) and/or various applications that can be loaded thereto (e.g., from memory device 103 via controller circuitry 105). The OS and/or various applications can be loaded from the memory device 103 by providing access commands from the host 102 to the memory device 103 to access the data comprising the OS and/or the various applications. The host 102 can also access data utilized by the OS and/or various applications by providing access commands to the memory device 103 to retrieve said data utilized in the execution of the OS and/or the various applications.

For clarity, the computing system 100 has been simplified to focus on features with particular relevance to the present disclosure. The memory array 110 can be a DRAM array, SRAM array, STT RAM array, PCRAM array, TRAM array, RRAM array, NAND flash array, and/or NOR flash array, for instance. The array 110 can comprise memory cells arranged in rows coupled by access lines (which may be referred to herein as word lines or select lines) and columns coupled by sense lines (which may be referred to herein as digit lines or data lines). Although a single array 110 is shown in FIG. 1, embodiments are not so limited. For instance, memory device 103 may include a number of arrays 110 (e.g., a number of banks of DRAM cells).

The memory device 103 includes address circuitry 106 to latch address signals provided over an interface 104. The interface can include, for example, a physical interface employing a suitable protocol (e.g., a data bus, an address bus, and a command bus, or a combined data/address/command bus). Such protocol may be custom or proprietary, or the interface 104 may employ a standardized protocol, such as Peripheral Component Interconnect Express (PCIe), Gen-Z interconnect, cache coherent interconnect for accelerators (CCIX), or the like. Address signals are received and decoded by a row decode 108 and a column decode 112 to access the memory array 110. Data can be read from the memory array 110 by sensing voltage and/or current changes on the sense lines using sensing circuitry 111. The sensing circuitry 111 can comprise, for example, sense amplifiers that can read and latch a page (e.g., row) of data from the memory array 110. The I/O circuitry 107 can be used for bi-directional data communication with the host 102 over the interface 104. The read/write circuitry 113 is used to write data to the memory array 110 or read data from the memory array 110. As an example, the circuitry 113 can comprise various drivers, latch circuitry, etc.

Control circuitry 105 decodes signals provided by the host 102. The signals can be commands provided by the host 102. These signals can include chip enable signals, write enable signals, and address latch signals that are used to control operations performed on the memory array 110, including data read operations, data write operations, and data erase operations. In various embodiments, the control circuitry 105 is responsible for executing instructions from the host 102. The control circuitry 105 can comprise a state machine, a sequencer, and/or some other type of control circuitry, which may be implemented in the form of hardware, firmware, or software, or any combination of the three. In some examples, the host 102 can be a controller external to the memory device 103. For example, the host 102 can be a memory controller which is coupled to a processing resource of a computing device. Data can be provided to the memory array 110 and/or from the memory array via the data lines 116.

In various instances, the functionality of the memory device 103 can be controlled by the host 102. For examples, the host 102 can provide commands to the memory device 103 through the interface 104 to read the memory array 110 and/or write to the memory array 110, among other functionalities of the memory array 110.

Figure 3:
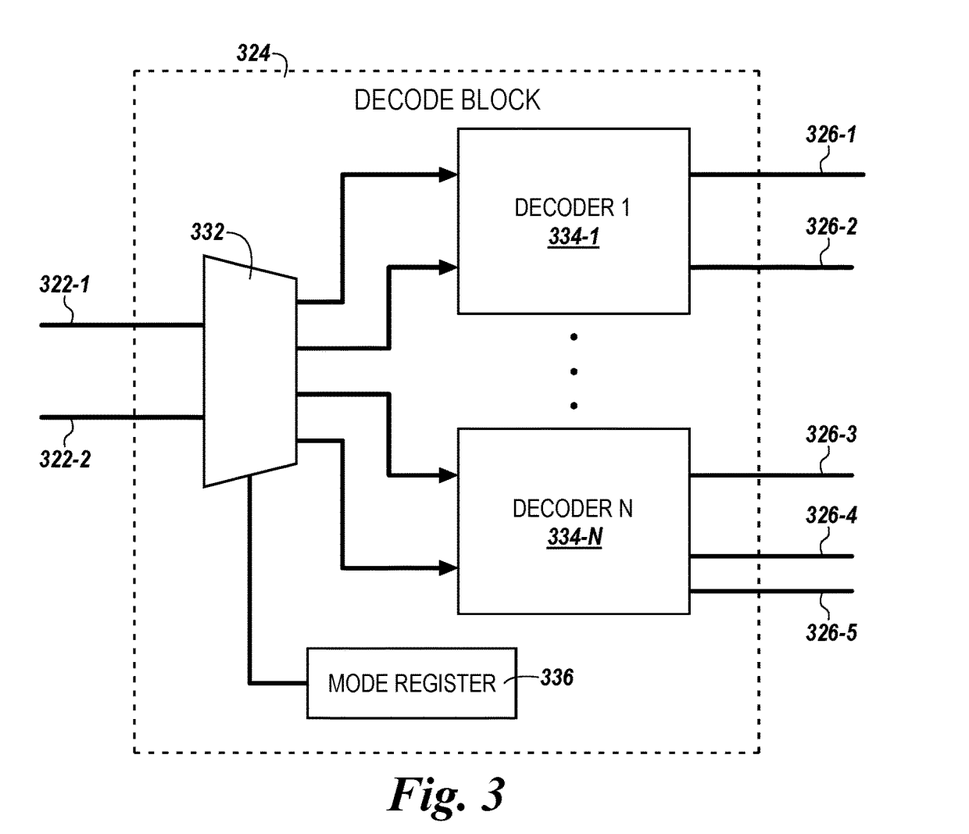
FIG. 3 is a block diagram of a decode block including a plurality of decoders in accordance with a number of embodiments of the present disclosure.

In various instances the control circuitry 105 can comprise a mode register 336 in FIG. 3. The mode register can be used to determine whether to implement a first interface protocol or a second interface protocol. The first interface protocol and the second interface protocol can correspond to a number of decoders to decode signals provided via a number of pins of the memory device 203. For example, selecting a first interface protocol or a second interface protocol can include utilizing a first decoder or a second decoder to decode the signals received via the plurality of pins of the memory device 103. The decoders can provide signals to the row control 108 and/or the column control 112 to implement the first interface protocol or the second interface protocol.

Figure 2:
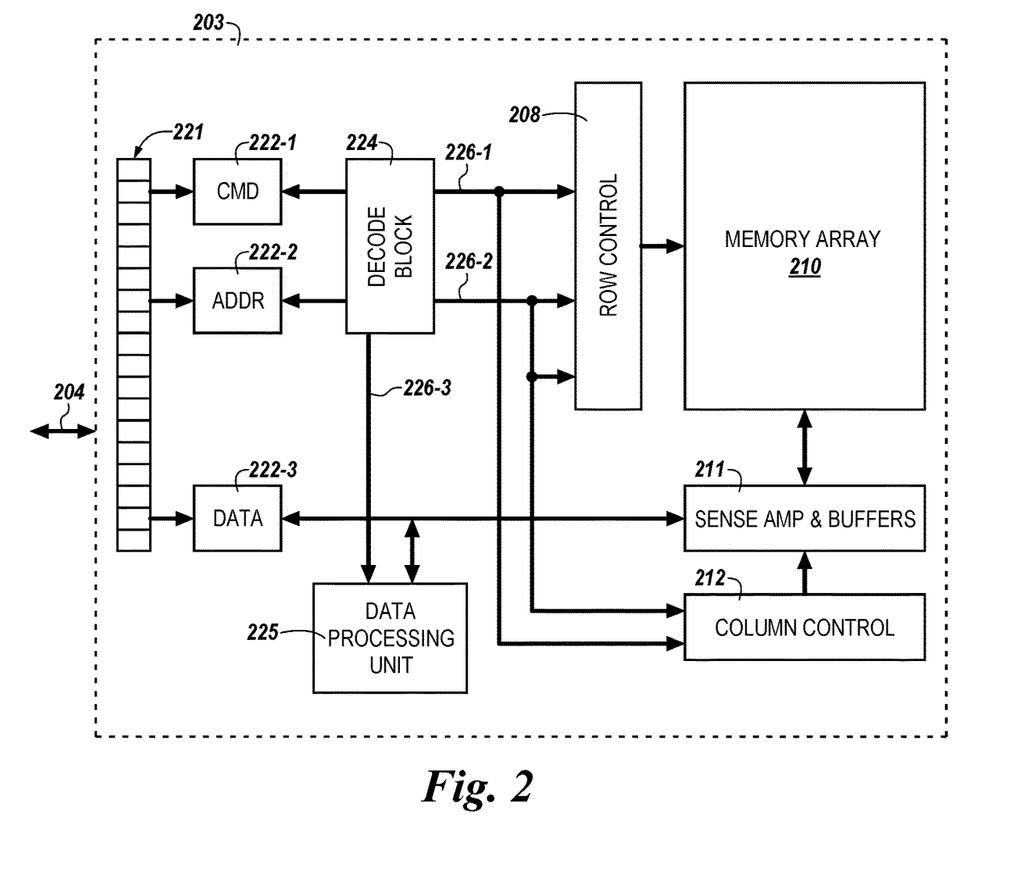
FIG. 2 is a block diagram an apparatus in the form of a memory device including a decode block in accordance with a number of embodiments of the present disclosure.

FIG. 2 is a block diagram an apparatus in the form of a memory device 203 including a decode block 224 in accordance with a number of embodiments of the present disclosure. The memory device 203 includes an interface 204, command lines 222-1, address lines 222-2, and data lines 222-3. The memory device 203 also includes the decode block 224 which is further described in FIG. 3. The memory device 203 further includes row control 208, column control 212, memory array 210, and sensing circuitry 211. The memory device 203 is also shown as including a data processing unit 224.

The interface 204 can include a plurality of pins 221 that couple the memory device 203 to a host such as the host 102. The interface 204 can form a physical connection through a plurality of pins 221, which can be metal connections. The pins 221 of the interface 204 can be composed of metals such as copper, nickel, and/or gold, among other types of metals. The pins 221 of the interface 204 can include top pins and bottom pins. The top pins and the bottom pins can include pins formed on either side of a circuit board and are not intended to limit the orientation of the pins 221 on the memory device 203.

The pins 221 of the interface 204 can include power (PWR) pins, ground (GND) pins, and signal pins, among other possible types of pins. The PWR pins can provide power to the memory device 203, the GND pins can provide a ground connection to the memory device 203, and the signal pins can provide signals to and from the memory device 203. For example, the signal pins can provide signals from a host to the memory device 203 and can provide signals from the memory device 203 to the host. The signals provided to the memory device 203 and/or from the memory device 203 can include command signals, address signals, and/or data signals, among other types of signals that can be communicated via the signal pins.

The command signals, address signals, and/or data signals can be referred to as commands, addresses, and/or data. The memory device 203 can receive the commands, addresses, and/or data via the interface 204. The interface 204 can provide the commands, addresses, and/or data within the memory device utilizing command lines 222-1, address lines 222-2, and data lines 222-3. The command lines 222-1, the address lines 222-2, and/or the data lines 222-3 are described as providing, commands, addresses, and/or data in view of widely accepted interface protocols such as DDR 5, however embodiments are not so limited.

In a number of examples, the signals provided via the command lines 222-1 and address lines 222-2 can be decoded by a decode block 224. The decode block 224 can rout the signals to the row control 208, the column control 212, and/or the data processing unit 225. The decoding of the signals received via the command lines 222-1, address lines 222-2, and/or data lines 222-3, the generating of different signals responsive to the decoding of the signals, and/or the providing of the signals/different signals to the row control 208, the column control 212, and/or the data processing unit 225 can be defined by an interface protocol. For example, the decode block 224 can decode a signal received via a particular pin of the interface 204 using a first interface protocol and can provide a signal to the data processing unit 225 via line 226-3. The decode block 224 can decode the same signal received via the particular pin of the interface 204 using a second interface protocol and can provide a signal to the row control 208 and/or the column control 212 instead via lines 226-1 and/or 226-2. As such, the decode block 224 can activate different portions of the memory device 203 based on signals provided through the pins 221 of the interface 204 and based on a particular interface protocol used to decode said signals. The operating mode of decode block 224, which may also be referred to as a decoder, may be set as described with reference to FIG. 3.

The interface protocol can define a type and a function of a signal received through a particular pin. For example, an interface protocol can define that signals provided through one or more pins of the interface 204 can be command signals, such as a read command, write command, a mode register read command, and/or a mode register write command, among other types of commands. The interface protocol can also define that one or more pins receive addresses. The interface protocol can further define that multiple pins can identify a command that is received by the memory device 203. For example, the addresses received by the memory device 203 can modify a command received by the memory device 203 through a pin. An address and a command received through two or more pins of the interface 204 can be interpreted as a particular command if the address has a first value and can be interpreted as a different command if the address has a second value.

However, an interface protocol may not define commands associated with the data processing unit 225. The data processing unit 225 is an example of a functionality of the memory device 203 that may not be supported by an interface protocol such as DDR5. It may be desirable for the memory device 203 to receive commands that define a configuration of the data processing unit 225, for example. The memory device 203 may be configured with functionalities that may be controlled externally from the memory device 203. Said functionalities may be controlled utilizing commands not supported by an interface protocol. To support said commands, the memory device 203 may implement multiple interface protocols. For example, the memory device 203 can implement a first interface protocol and a second interface protocol.

Each of the interface protocols supported by the memory device 203 may support different commands. For example, a first interface protocol can support a first command that is not supported by the second interface protocol and the second interface protocol may support a second command that is not supported by the first interface protocol. In some examples, the interface protocols may support a same command. For example, the first interface protocol can support a command that is also supported by a second interface protocol.

Different interface protocols supported by the memory device 203 can define different types of signals or different actions to be taken by the memory device 203 in response to signals that are received through a particular pin. For example, a first interface protocol can define that commands are provided through a particular pin and the second interface protocol can define that addresses and/or data are provided through the particular pin. Different interface protocols can also support a same type of signal or a same action to be taken by the memory device 03 in response to a signal through a particular pin. For example, a first interface protocol and a second interface protocol can support commands though a particular pin.

The particular interface protocol utilized by the decode block 224 can be selected by a device external to the memory device 203 utilizing a command or plurality of commands. For example, a host may provide a command to select a first interface protocol or a second interface protocol. The decode block 224 can utilize the selected interface protocol to provide signals to the row control 208, the column control 212 and/or other components of the memory device 203.

The host may select a first interface protocol and may thereafter provide commands to the memory device 203 that are compliant with the first interface protocol. The host may subsequently select a second interface protocol and may thereafter provide commands to the memory device 203 that are compliant with the second interface protocol. If the host desires to provide additional commands compliant with the first interface protocol, the host can select the first interface protocol prior to providing the additional commands. The host may select a interface protocol by writing a mode register, for example, as described with reference to FIG. 3. In some examples, the host may select an interface protocol using signaling over another bus or set of pins, such as a bus configured for I2C or I3C signaling. In other examples, one or more bits in a command or data packet may indicate the protocol used.

An example of commands that may be included in an interface protocol that may not be included in different interface protocols can include commands to perform operations on data utilizing the data processing unit 225. For example, an interface protocol can include commands to read data from the array 210 and perform a plurality of logical operations on the data utilizing the data processing unit 225 prior to providing the data utilizing the data line 222-3.

The decode block 224 can be implemented in the control circuitry 105 of FIG. 1 and/or can be implemented externally to the control circuitry 105 but internally to the memory device 203. The decode block 224 can include a register to store a value indicating a selected interface protocol.

The interface protocols that can be selected can define the signals provided through the interface 204. For example, a first interface protocol can fully define the signals provided via the interface 204 and a second interface protocol can also fully define the signals provided via the interface 204. That is, each of the interface protocols can stand alone without relying on the other interface protocols. For example, a first interface protocol can define the signals provided through each of the pins 221 of the interface 204 such that the decode block 224 does not rely on a different interface protocol when the first interface protocol is selected.

Each of the interface protocols may not be compliant with any of the other interface protocols. For instance, an interface protocol that defines commands used to configure the data processing unit 225 may not be compliant with a DDR5 interface protocol and the DDR 5 interface protocol may not be compliant with the interface protocol that defines commands used to configure the data processing unit 225.

Defining different interface protocols can be different than repurposing a pin utilizing a single interface protocol. For example, an interface protocol can provide for pins that are "open." An open pin describes a pin that can be used to provide signals that are not defined by the interface protocol. However, providing a signal such as a command through an open pin does not make the interface protocol noncompliant with itself when an address is provided through the open pin. The interface protocol continues to be compliant with itself when different types of signals are provided through an open pin because the pin is open. However, redefining any or each of the non-open pins can result in different interface protocols being noncompliant with each other.

As used herein, compliance describes the ability to decode signals received through each of the pins utilizing an interface protocol to provide the desired functionality. Compliance can also include encoding signals utilizing the interface protocol without degrading data encoded through the signals. For example, if a host provides a signal representing a read command through a particular pin to the memory device 203 using a first interface protocol, and the memory device decodes the signal as a write command utilizing a second interface protocol, then the first interface protocol is noncompliant with the second interface protocol. Decoding a single signal as anything other than what it was encoded to be can result in noncompliance between the interface protocol used to encode the signal and the interface protocol used to decode the signal with the exception of signals provided via an open pin.

An interface protocol can be used to encode or decode a signal. For example, a host can encode a signal utilizing a same interface protocol that is used by the memory device 203 to decode the signal.

FIG. 3 is a block diagram of a decode block 324 including a plurality of decoders in accordance with a number of embodiments of the present disclosure. The decode block 324 can include a multiplexer (MUX) 332 and decoders 334-1, . . . , 334-N, referred to collectively as decoders 334. The decode block 324 can also include a mode register 336.

The decode block 324 can receive command lines 322-1 and address lines 322-2. Although the command lines 322-1 and the address lines 322-2 are each shown as a single line, the command lines 322-1 and/or the address lines 322-2 can represent one or more lines that directly or indirectly couple the pins of a physical interface of a memory device to the decode block 324.

In various instances, an interface protocol can be implemented using one of the decoders 334. Accordingly, multiple interface protocols can be implemented using the decoders 334. Each of the decoders 334 can decode command lines 322-1 and address lines 322-2. Each of the decoders 334 can activate one or more portions of the memory device utilizing lines 326-1, 326-2, 326-3, 326-4, and/or 326-5, referred to collectively as lines 326. Although each of the lines 326 is shown as a single line, each of the lines can be implemented using one or more lines.

The decoder 334-1 can be coupled to a row decode via line 326-1 and a column decode via line 326-2 but may not be coupled to a data processing unit (e.g., data processing unit 225 of FIG. 2) because an interface protocol implemented using the decoder 334-1 may not be configured to receive signals for the data processing unit and may not be configured to provide signals to the data processing unit. Accordingly, the decoder 334-1 may not be coupled to the data processing unit because the interface protocol may not be configured to include an interface for the data processing unit.

The decoder 334-N can be coupled to the row decode via line 326-3, the column decode via line 326-4, and the data processing unit through line 326-5. The decoder 334-N may be coupled to the data processing unit because an interface protocol implemented using the decoder 334-N can be configured to receive signals for the data processing unit and can be configured to provide signals to the data processing unit. Accordingly, the decoder 334-N can provide an interface for the data processing unit to provide access to the data processing unit, wherein the access is provided to devices external to a memory device hosting the decode block 324.

The lines 322-1 and 322-2 are coupled to each of the decoders 334. In various examples, the decode block 324 can couple the lines 322-1 and 322-2 to one of the decoders 334 at a time. The decode block 324 can couple the lines 322-1 and 322-2 to the decoders 334 based on the input of a mode register 336. The mode register 336 can be used to select an interface protocol by providing the signals provided through the lines 322-1 and 322-2 to the decoders 334. For example, if the mode register 336 is set, a first interface protocol can be selected by providing the signals provided through the lines 322-1 and 322-2 to the decoder 334-1. If the mode register 336 is not set, a different interface protocol can be selected by providing the signals provided through the lines 322-1 and 322-2 to a different decoder such as decoder 324-N.

Although a single mode register 336 is shown, multiple mode registers can be implemented in the decode block 324. For example, a quantity of mode registers equal to the quantity of decoders 334 can be implemented or a quantity of mode registers less than the quantity of decoders 334 can be implemented where the quantity of mode registers are capable of storing a value corresponding to each of the decoders 334.

As used herein, a mode register 336 can include registers that can be accessed externally to a memory device that hosts the decode block 324. The mode register 336 can be set or reset utilizing commands provided through pins that are defined as being open according to an interface protocol. For example, an interface protocol can define a pin as open such that commands not defined by the interface protocol can be provided through said open pin. Read or write commands provided to the decode block 324 can be used to set or reset a mode register 336. Setting the mode register 336 can activate, for example, a decoder 334-1 while deactivating the mode register 336 can activate a decoder 334-N. Accordingly, the mode register 336 can be used to select a decoder, which in turn selects an interface protocol used to decode signals provided through lines 322-1 and 322-2.

If the mode register 336 selects the decoder 334-1 then the signals provided through the lines 322-1 and 322-2 are provided to the decoder 334-1 and not to any other decoders, such as the decoder 334-N. If the mode register 336 selects the decoder 334-N then the signals provided through the lines 322-1 and 322-2 are provided to the decoder 334-N and not to any other decoders, such as the decoder 334-1, for example.

The decoder 334-N implements an interface protocol that defines signals to control the data processing unit. Other decoders can be coupled to more or fewer components of the memory device based on the interface protocols than the decoders implement. For example, if the interface protocol defines signals provided to/from an apparatus of the memory device then the corresponding decoder can be coupled to said apparatus of the memory device.

The decode block 324 can be implemented as part of the control circuitry of a memory device. The decode block 324 can also be implemented externally to the control circuitry but internally to the memory device.

As used herein, utilizing or implementing an interface protocol includes utilizing or implementing a decoder such as decoders 334. For example, a first interface protocol can be utilized to decode signals received at the decode block 324 by utilizing the decoder 334-1 to decode said signals.

In various examples, a host providing commands to a memory device may select the interface protocols implemented in the memory device if the host is configured to provide commands defined by said interface protocols. In some examples, a host may select a portion of the interface protocols without implementing all of the interface protocols implemented by a memory device. The host can be configured to utilize different interface protocols through the software and/or firmware that comprises the host.

Figure 4:
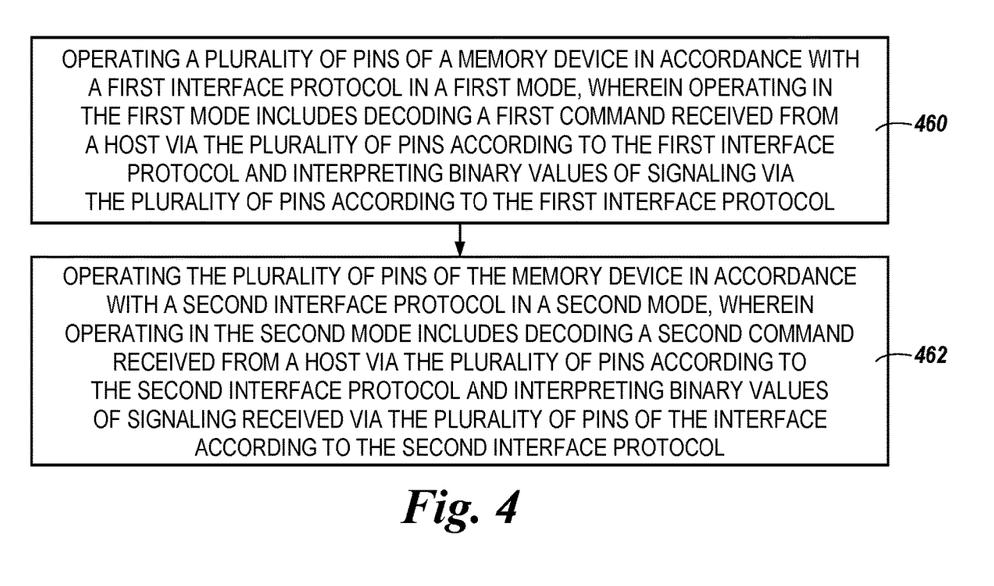
FIG. 4 illustrates an example flow diagram of a method for performing operations in memory in accordance with a number of embodiments of the present disclosure.

FIG. 4 illustrates an example flow diagram of a method for performing operations in memory in accordance with a number of embodiments of the present disclosure. At 460, a plurality of pins of a memory device can be operated in accordance with a first interface protocol in a first mode. Operating the plurality of pins in accordance with a first mode can include decoding a first command received from a host via the plurality of pins according to the first interface protocol. Operating the plurality of pins in accordance with the first mode can further include interpreting binary values of signaling via the plurality of pins according to the first interface protocol.

At 462, a plurality of pins of the memory device can be operated in accordance with a second interface protocol in a second mode. Operating the plurality of pins of the memory device in the second mode can include decoding a second command received from a host via the plurality of pins according to the second interface protocol. Operating the plurality of pins of the memory device in the second mode can further include interpreting binary values of singling received via the plurality of pins of the interface according to the second interface protocol.

Decoding the second command can comprise decoding a command to perform a logical operation on data stored in the memory device. The second command may not be compliant to the first interface protocol. Utilizing the first interface protocol, the second command may be decoded as operations other than the logical operation defined under the second interface protocol.

The method can further include configuring the memory device to change from the first mode to the second in response to receiving a command to change the operating mode from a host. For example, the command can be implemented by the memory device to set a mode register to reflect a second mode such that the plurality of pins of the memory device operate in the second mode. Operating the plurality of pins of the memory device can also include transmitting signaling that indicates an acknowledgment to the host in response to receiving the command to change the operating mode.

Operating the plurality of pins of the memory device in accordance with the second interface protocol can further comprise receiving and executing commands that do not comply with the first interface protocol. Operating the plurality of pins of memory device in accordance with the first interface protocol can also comprise receiving and executing commands that do not comply with the second interface protocol.

A same pin of the plurality of pins under a first interface protocol or a second interface protocol can be configured to receive mode register write commands to select a first mode or a second mode. That is, a same pin under the first interface protocol or the second interface protocol can be configured to receive mode register write commands.

A first pin of the plurality of pins can also be configured under the first interface protocol to receive mode register write commands to select a second mode. A second pin of the plurality of pins can further be configured under the second interface protocol to receive the mode register write commands to select a first mode, wherein the first pin and the second pin are different pins.

In various examples, a system can include a mode register and control circuitry coupled to the mode register. The control circuitry can be configured to cause a command to set the mode register. The plurality of pins can be configured from a first interface protocol to a second interface protocol responsive to setting the mode register. Different commands received can be decoded utilizing the second interface protocol based on setting the more registers. Previously to setting the mode register, the different commands received would have been decoded utilizing the first interface protocol.

The second interface protocol may not be compliant with the first interface protocol. The first interface protocol also may not be compliant with the second interface protocol. In some examples, a second interface protocol may be compliant with the first interface protocol even though the first interface protocol is noncompliant with the second interface protocol if the second interface protocol is a subset of the first interface protocol. For example, the second interface protocol can define a plurality of signals while the first interface protocol defines the plurality of signals and also defines an additional plurality of signals. The second interface protocol may be noncompliant with the first interface protocol if the second interface protocol includes commands not included in the first interface protocol.

In various examples, a memory apparatus can comprise an interface, a first decoder, a second decoder, and a mode register. The interface can be configured to receive signals from a host and can comprise a plurality of pins. The first decoder can be coupled to the interface and can be configured to interpret binary values of signaling received via the plurality of pins in accordance with a first interface protocol. A second decoder can also be coupled to the interface and can be configured to interpret binary values of signaling received via the plurality of pins in accordance with a second interface protocol. The mode register can also be coupled to the interface and can also be configured to receive a set command via the interface and cause subsequently received commands via the plurality of pins to be decoded by either the first decoder or the second decoder based on the set command.

The interface can include a multiplexor coupled to the first decoder, the second decoder, and the mode register. The mode register can be configured to cause the multiplexor to route signals to either the first decoder or the second decoder based on the set command.

The second decoder can be configured to redefine functionality of a plurality of pins of the interface in response to the set command dictating operation according to the second interface protocol. For example, the second decoder can redefine the signals provided through the pins such that the signals provided though the pins can be interpreted differently under second interface protocol as compared to a first interface protocol.

The first decoder and the second decoder can be coupled to a column decode and a row decode. The first decoder and the second decoder can be configured to provide signals to each of the column decode and the row decode responsive to being activated. However, the routing of signals from the pins of the memory device to the column decode and the row decode can be different depending on whether the signals are routed through the first decoder or the second decoder.

The first interface protocol can include commands not included in the second interface protocol. Signals provided through a particular pin can be decoded as a first command in the first interface protocol while any signals provided through a plurality of pins may not be decoded as the first command in the second interface protocol. The same can be true for commands included in the second interface protocol which may not be included in the first interface protocol.

Figure 5:
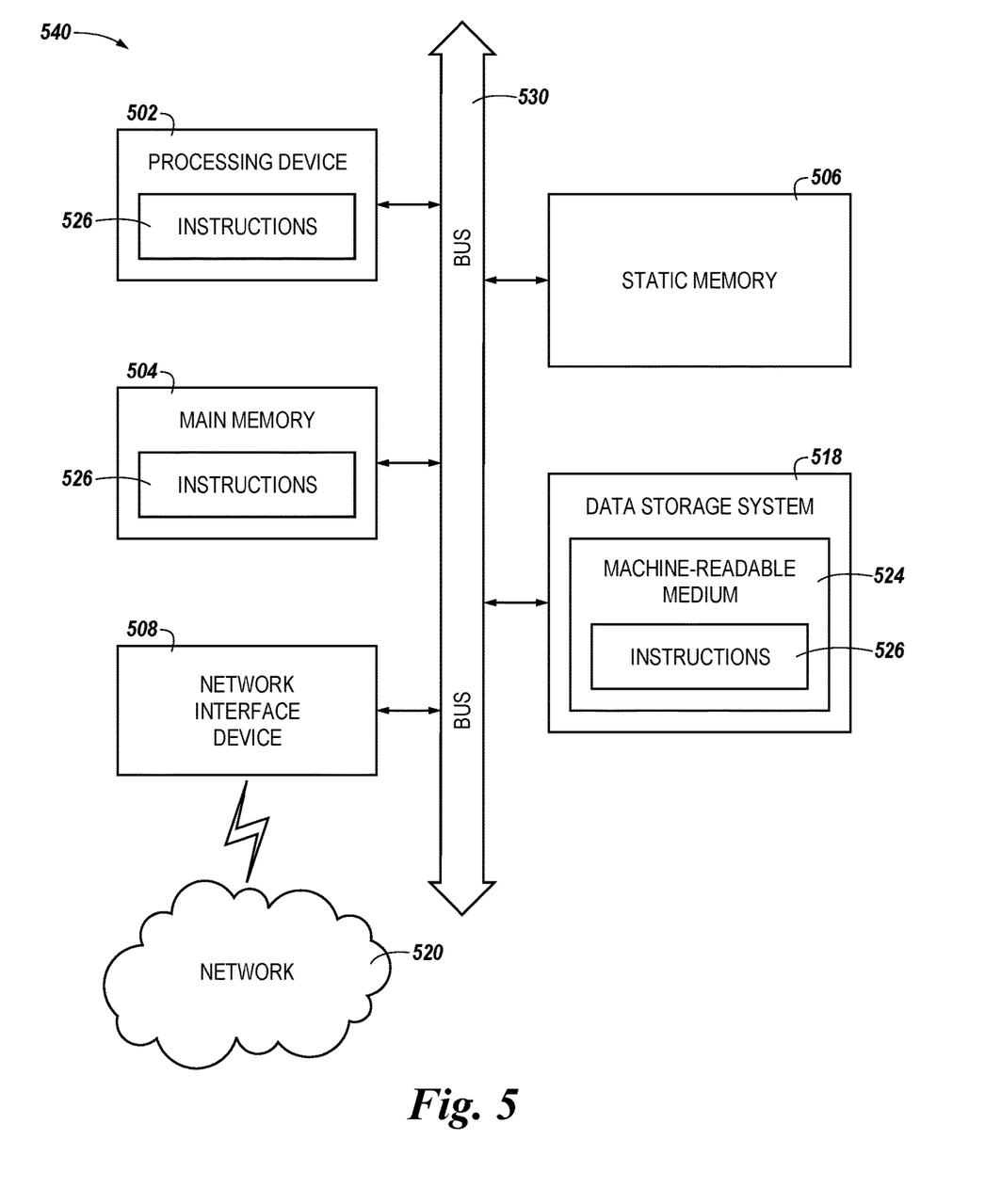
FIG. 5 illustrates an example machine of a computer system within which a set of instructions, for causing the machine to perform various methodologies discussed herein, can be executed.

FIG. 5 illustrates an example machine of a computer system 540 within which a set of instructions, for causing the machine to perform various methodologies discussed herein, can be executed. In various embodiments, the computer system 540 can correspond to a system (e.g., the system 100 of FIG. 1) that includes, is coupled to, or utilizes a memory sub-system (e.g., the memory device 103 of FIG. 1) or can be used to perform the operations of a controller (e.g., the controller circuitry 105 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 540 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 540 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 540, the main memory 504 and the processing device 502 also constituting machine-readable storage media.

In one embodiment, the instructions 526 include instructions to implement functionality corresponding to the host 102 and/or the memory device 103 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

As used herein, "a number of" something can refer to one or more of such things. For example, a number of memory devices can refer to one or more memory devices. A "plurality" of something intends two or more. Additionally, designators such as "N," as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combinations of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A computing apparatus, comprising:
   a memory device;
   a processing resource coupled to the memory device and configured to:
      provide a first command to the memory device wherein the first command is compliant with a first standardized interface protocol of the memory device;
      provide a second command to the memory device to set a mode register of the memory device;
      provide a third command to the memory device wherein the third command is not compliant with the first interface protocol of the memory device; and
      provide a fourth command to the memory device to reset the mode register.

2. The computing apparatus of claim 1, wherein the third command is compliant with a second interface protocol.

3. The computing apparatus of claim 2, further comprising instructions stored in a tangible machine readable medium, wherein the instructions are executable by the processing resource to:
   provide a first plurality of commands that are compliant with the first interface protocol; and
   provide a second plurality of commands that are compliant with the second interface protocol.

4. The computing apparatus of claim 1, wherein the processing resource is further configured to;
   provide a fifth command to the memory device to set the mode register of the memory device; and
   provide a sixth command to the memory device wherein the sixth command is compliant with a second interface protocol, and the third command is compliant with a third interface protocol.

5. The computing apparatus of claim 1, wherein the processing resource is further configured to provide the third command to configure a different processing resource of the memory device.

6. The computing apparatus of claim 1, wherein the processing resource is further configured to provide the third command to configure a delivery of data from the memory device.

7. A memory apparatus, comprising:
   an interface comprising a plurality of pins;
   a mode register;
   a first decoder coupled to the interface, wherein the first decoder is configured to interpret binary values of a first command received via the plurality of pins in accordance with a first interface protocol responsive to the mode register being set;
   a second decoder coupled to the interface, wherein the second decoder is configured to interpret binary values of a third command received via the plurality of pins in accordance with a second interface protocol responsive to the mode register being reset; and
   control circuitry coupled to the first decoder, the second decoder, and the mode register, and configured to:
      receive a second command via the interface to set the mode register; and
      receive a fourth command to the memory device to reset the mode register.

8. The memory apparatus of claim 7, wherein the interface includes a multiplexor coupled to the first decoder, the second decoder, and the mode register; and
   wherein the mode register is configured to cause the multiplexor to route signals to either the first decoder or the second decoder based on the mode register being set.

9. The memory apparatus of claim 7, wherein the second decoder is configured to redefine functionality of the plurality of pins of the interface based on the mode register being reset.

10. The memory apparatus of claim 7, wherein the first decoder and the second decoder are coupled to a column decode and a row decode and are further configured to provide signals to each of the column decode and the row decode responsive to the mode register being set state or reset.

11. The memory apparatus of claim 7, wherein the first interface protocol includes commands not included in the second interface protocol.

12. The memory apparatus of claim 7, wherein the second interface protocol includes commands not included in the first interface protocol.

13. The memory apparatus of claim 7, wherein the mode register is further configured to cause subsequently received commands and addresses to be decoded by either the first decoder or the second decoder based on being set or reset.

14. A method, comprising:
   decoding a first command received from a host via a plurality of pins according to a first interface protocol based on a mode register of a memory device reflecting a first mode;
   interpreting binary values of the first command received via the plurality of pins according to the first interface protocol;
   receive a second command to set the mode register to reflect the second mode;
   decoding a third command received from the host via the plurality of pins according to the second interface protocol based on the mode register reflecting a second mode;
   interpreting binary values of the third command received via the plurality of pins according to the second interface protocol; and
   receiving a fourth command to reset the mode register to reflect the first mode.

15. The method of claim 14, wherein decoding the third command comprises decoding a command to perform a logical operation on data stored in the memory device.

16. The method of claim 14, further comprising changing from a standardized interface protocol to a non-standardized interface protocol in response to receiving the second command.

17. The method of claim 16, further comprising transmitting signaling that indicates an acknowledgment to the host in response to receiving the command to change the operating mode.

18. The method of claim 14, wherein decoding the third command comprises receiving and executing commands that do not comply with the first interface protocol.

19. The method of claim 14, further comprising configuring a same pin of the plurality of pins under the first interface protocol or the second interface protocol to receive mode register write commands to select the first mode or the second mode.

20. The method of claim 14, further comprising:
configuring a first pin of the plurality of pins under the first interface protocol to receive mode register write commands to select the second mode; and
configuring a second pin of the plurality of pins under the second interface protocol to receive the mode register write commands to select the first mode, wherein the first pin and the second pin are different pins.

* * * * *